United States Patent [19]

Rittenbach

[11] 4,331,925
[45] May 25, 1982

[54] FALSE COUNT CORRECTION IN FEEDBACK SHIFT REGISTERS AND PULSE GENERATORS USING FEEDBACK SHIFT REGISTERS

[75] Inventor: Otto E. Rittenbach, Neptune, N.J.

[73] Assignee: The United States of America as represented by the Secretary of the Army, Washington, D.C.

[21] Appl. No.: 160,349

[22] Filed: Jun. 17, 1980

Related U.S. Application Data

[63] Continuation-in-part of Ser. No. 973,642, Dec. 26, 1978, Pat. No. 4,237,464.

[51] Int. Cl.³ .......................................... H03K 21/34
[52] U.S. Cl. ...................................... 328/42; 328/37; 307/224 R
[58] Field of Search ............... 328/37, 42; 307/221 R, 307/224 R

[56] References Cited

U.S. PATENT DOCUMENTS

| | | | |
|---|---|---|---|
| 2,846,594 | 8/1958 | Pankratz et al. | 307/224 R |
| 3,051,855 | 8/1962 | Lee | 307/224 R |
| 3,350,580 | 10/1967 | Harrison | 307/224 R |
| 3,548,319 | 12/1970 | Price | 328/42 |

Primary Examiner—John S. Heyman
Attorney, Agent, or Firm—Nathan Edelberg; Jeramiah G. Murray; John W. Redman

[57] ABSTRACT

A pulse train generator comprising a shift register with feedback for producing an output pulse for every m clock pulses applied to the shift register stages. The feedback shift register normally has a maximal length $2^n-1$, where n is the number of stages. Clock pulses are applied to the shift register until an all-ONE condition is reached; thereupon, (m-1) additional clock pulses are applied and the states of the register stages can then be sensed. False count correction is obtained by the combination of a detector and an analog integrator.

12 Claims, 5 Drawing Figures

FALSE COUNT CORRECTION IN FEEDBACK SHIFT REGISTERS AND PULSE GENERATORS USING FEEDBACK SHIFT REGISTERS

This invention may be manufactured by or for the Government, for governmental purposes, without the payment of any royalties thereon or therefor.

This application is a continuation-in-part of my parent application, Ser. No. 973,642 now U.S. Pat. No. 4,237,464 entitled "Radar Antenna", filed Dec. 26, 1978.

In this parent application, and in another continuation-in-part application filed by me May 9, 1980, Ser. No. 148,324 entitled "Pulse Train Generator of Predetermined Pulse Rate Using Feedback Shift Register", a pulse train generator is described which includes a shift register with feedback for producing an output pulse for every m clock pulses applied to the shift register stages. The feedback shift register normally has a maximal length $2^n-1$, where n is the number of stages. Clock pulses are applied to the shift register until an all-ONE condition is reached; thereupon, (m-1) additional clock pulses, where m can be less than n, are applied and the states of the register stages can then be sensed. Appropriate gate circuits are added to the shift register, including an n-input inverting AND gate, depending upon the sensed register states, to inhibit certain shifts and to insure that the register is returned to the all-ONE condition upon arrival of every mth clock pulse. The pulse generator referred to above provides means for obtaining an output pulse for every m bits of the code length.

The feedback shift register, per se—without the added gate circuits—can be used, for example, for code generation, with the outputs being derived from each of the various stages (flip-flops) of the shift register.

In certain instances, owing generally to the sudden presence of noise or other transient disturbances, the shift register stages can be forced into a condition wherein the corresponding outputs of each and every one of the shift register stages (flip-flops) is a ZERO. In this abnormal condition, the feedback shift register cannot generate code; in other words, the shift register remains in a fixed or static condition. Similarly, if the feedback shift register is used, with appropriate additional gate circuitry, as a pulse generator, the output pulses would cease when the aforesaid abnormal static condition of the shift register occurs.

A digital technique for preventing static condition retention in n-stage feedback shift registers makes use of an n-input and AND gate receptive of the corresponding $\overline{Q}$ outputs of each of the flipflops and the output of the gate is coupled to an OR gate which is in series with the clocked AND gate in the Q input of the first stage. The other input to the OR gate is derived from the output of the Exclusive OR gate in the shift register feedback circuit. If all Q outputs are ZERO then all inputs to the n-input AND gate, viz., the $\overline{Q}$ outputs of all stages, are ONES. Consequently, a ONE is derived at the output of the n-input AND gate which is connected to one input of the OR gate. A ONE is derived at the output of the OR gate and, upon receipt of the next clock pulse, this ONE is transferred to the Q input of the first flipflop, thereby converting the ZERO in the Q output of the first stage from a ZERO to a ONE. Once one of the flipflop Q outputs is a ONE, normal shifting will ensue.

Similarly, for a pulse generator such as shown in my copending application entitled "Pulse Train Generator of Predetermined Pulse Rate Using Feedback Shift Register", an n-input AND gate and OR gate similar to that just described in connection with the shift register per se would be used, in addition to the inverting multiple input AND gate 45, 46 of the pulse generator circuit. In the same manner, a ONE would be derived when all n of the Q outputs are ZEROS (viz., all $\overline{Q}$ outputs are ONES) and the ONE from the added n-input AND gate would operate on the additional OR gate in series with the first flipflop to change the Q output of the first flipflop (stage) from a ZERO to a ONE and permit normal shift register operation to occur.

In many practical applications of code generation using a shift register, particularly when security is a factor, one may want a long code requiring several stages. Similarly, in pulse generation, such as described in my copending application entitled "Pulse Train Generator of Predetermined Pulse Rate Using Feedback Shift Register", the factor m may easily be of the order of one million, in which case the shift register would require 20 stages ($2^{20}-1=1048575$).

If the digital technique just described is used in such cases, the n-input AND gate would be unduly complex and plagued by the well-known fanout problem.

In accordance with the invention, the false count correction can be obtained by the combination of a detector and an analog integrator and, in some cases, an inverter, for deriving a voltage level representing a ONE when, instead of the normal sequential changes in the output of ONES and ZEROS, there is a static condition in which all ZEROS appear in the Q outputs of all stages of the shift register.

This representative ONE voltage level, when coupled to a Q input of one of the shift register stages, causes the ZERO in that stage to shift from a ZERO to a ONE, whereupon, normal shift register action resumes.

In one embodiment of the invention, a detector and analog integrator, followed by an inverter, is positioned between the Q output of any one of the n stages of the shift register and an OR gate in the Q input of any of the n stages of the shift register. The detector may consist of a diode and a resistor in parallel and the integrator may consist of a capacitor in shunt with said detector. The detector and integrator may also be positioned between the $\overline{Q}$ output circuit of any of the n stages and an OR gate in the Q input circuit of any of the n stages; in this case, the inverter is omitted.

If the shift register is operating normally, the integrator output level will be substantially within the voltage range representative of a Q output of ONE. If ZEROS fill the shift register, this static condition will result in the output level of the detector-integrator approaching and eventually attaining a more negative value falling within a Q output voltage range of ZERO. In this static condition, this level, after inversion, is substantially equivalent to a ONE. This ONE output from the inverter in the output of the detector-integrator is applied to one of the inputs of the aforesaid OR gate and causes a ONE to be applied to the AND gate in the Q input of the stage with which the OR gate is associated. Upon receipt of the next clock pulse at the other input to this particular AND gate, a ONE is applied to the Q input of that stage and causes the ZERO already in that stage (that is, the Q output of that stage) to convert to a ONE.

With a ONE in any one of the stages of the shift register, the latter no longer is stalled with a load of ZEROS and the normal shifting operation commences.

Alternatively, the input to the detector-integrator can be supplied from the $\overline{Q}$ output of any stage, with proper diode connections; in this case the abnormal operation would result in the output of the detector-integrator increasing positively until the voltage level comes within the voltage range representative of a ONE. With this arrangement, an inverter can be eliminated.

In a second embodiment of the invention, the combination of detector and integrator, previously described, forms a portion of the Exclusive OR circuit (which inherently incorporates an inverter) which is inputted from the Q and $\overline{Q}$ output of the n th stage and the Q and $\overline{Q}$ output of one of the remaining n-1 stages of the shift register. The output of the Exclusive OR gate, which incorporates the detector and integrator, forms one input to the clocked AND gate in the Q input circuit of the first stage of the shift register. The Q output level of one of the shift register stages connected to the Exclusive OR circuit is connected to the detector thus incorporated into the Exclusive OR circuit.

During normal operation, a series of ZEROS and ONES appear in the Q output circuits of each of the shift register stages which are connected to the inputs of the Exclusive OR gate so that the integrator output level will tend to remain within a voltage range corresponding to a ONE. If for some reason, an undesirable condition occurs wherein ZEROS appear in the Q outputs of all stages of the shift register, the static input to the integrator will result in the integrator output slowly becoming mere negative until a level is reached which falls within the range corresponding to a ZERO. Because of inversion in the Exclusive OR gate, this ZERO condition is converted into a ONE condition. This ONE then is applied to the clocked AND gate in the Q input circuit of the first stage of the shift register.

The integration techniques already described obviously can be applied to a pulse generator using a feedback shift register such as described and illustrated in my copending application, Ser. No. 148,324, filed May 9, 1980, entitled "Pulse Train Generator of Predetermined Pulse Rate Using Feedback Shift Register", which is a continuation-in-part application based on my parent application, Ser. No. 973,642, filed Dec. 26, 1978.

The invention and its mode of operation will be more fully understood from the following detailed description taken in conjunction with the drawing wherein.

DESCRIPTION OF PREFERRED EMBODIMENTS

Figure 1:
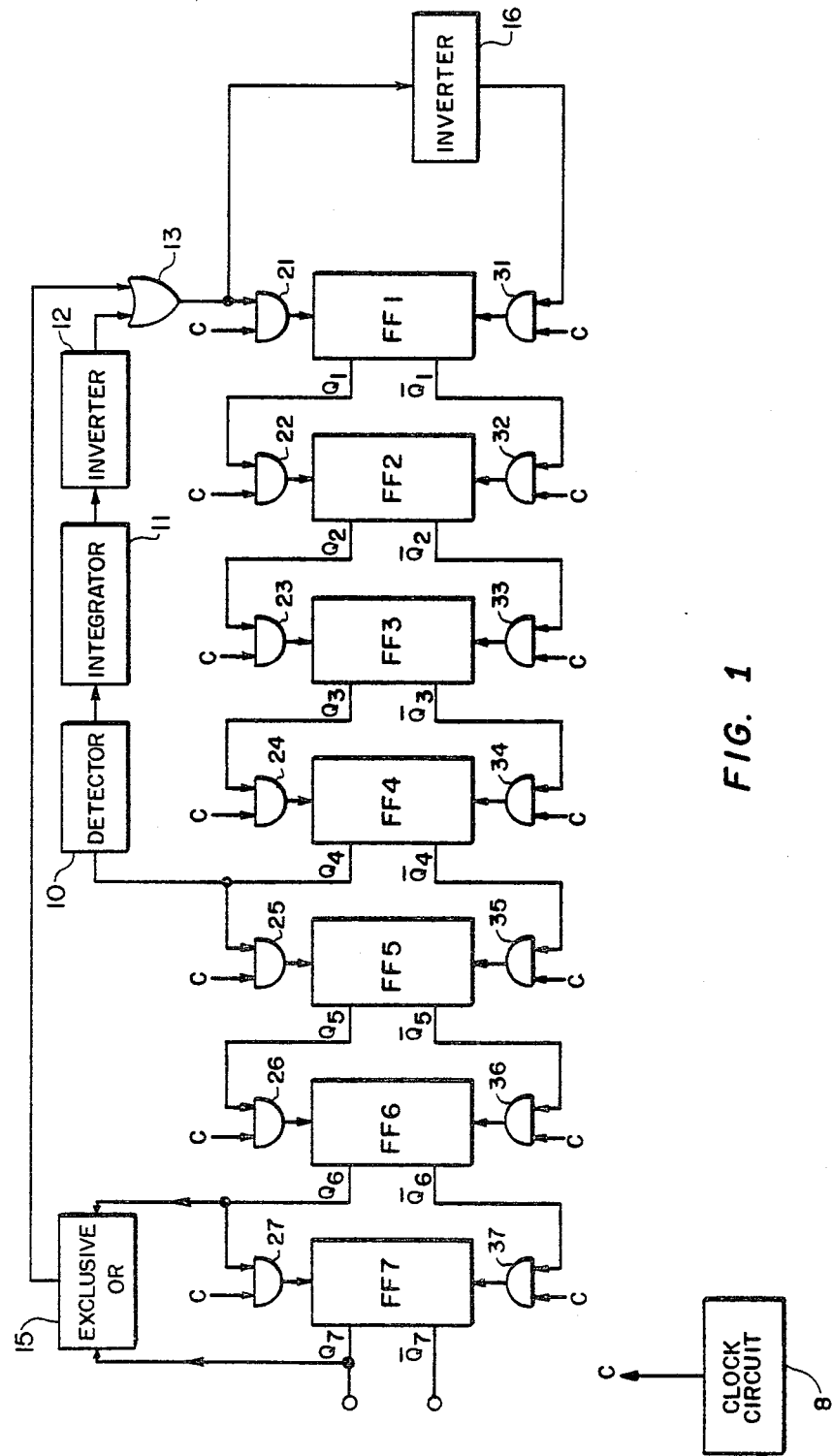
FIG. 1 is a block diagram of a feedback shift register incorporating one embodiment of an integration circuit according to the invention.

Referring now to FIG. 1 of the drawing, an n-stage shift register is shown with an Exclusive OR gate 15 and an inverter 16 connected between the final stage or flipflop FF7 and the first stage FF1. The Exclusive OR gate 15 enables the maximum count of the shift register to increase from n to $2^n-1$. As shown by way of example in FIG. 1, the shift register includes seven flipflops FF1 through FF7, each of which includes first and second inputs—indicated at the top and bottom of each flipflop—and first and secong complementary outputs Q and $\overline{Q}$. The inputs to the Exclusive OR gate 15 are derived from the Q outputs of the last flipflop FF7 and one of the other flipflops; in this case, the next to last flipflop FF6 has been chosen by way of example. The Exclusive OR gate 15 has a ONE in the output whenever the two Q outputs $Q_6$ and $Q_7$ of stages FF6 and FF7 are of differing state and has a ZERO in the output whenever the two outputs $Q_6$ and $Q_7$ are either both ones or are both ZEROS.

The number n of flipflops used will determine the normal maximum length of the feedback shift register, which is given by $2^n-1$ when an Exclusive OR gate is used in the feedback circuit. For the seven stage shift register shown in FIG. 1, the maximum length would be $2^7-1=127$. After 127 clock pulses C, the outputs of the shift register stages will resume its original sequence. If less stages, say 6 stages, are used, the maximum length of the shift register would be 63. The shift register of FIG. 1 includes a plurality of AND gates 21 to 27, the output of each of which is connected to a first (Q) input of a corresponding one of the flip-flops FF1 to FF7. A plurality of AND gates 31 to 37 are further provided; the output of each of the AND gates 31 to 37 is connected to a second ($\overline{Q}$) input of respective flipflops FF1 to FF7. All of the AND gates 21 to 27 and 31 to 37 are receptive of clock pulses C from a clock circuit 8.

The shift register is so connected that the first or Q outputs of each of the first six stages FF1 to FF6 is connected to one of the inputs to that one of AND gates 22 to 27 which is in the first (Q) input of the next stage. For example, the $Q_2$ output from stage FF2 forms one input to the AND gate 23. The output of the Exclusive OR gate 15 is connected to one input of the AND gate 21 of the first stage FF1. Further the second or $\overline{Q}$ outputs of each of the first six stages is connected to an input of that one of the AND gates 32 to 37 which is in the second or $\overline{Q}$ input circuit of the next stage. For example, the $\overline{Q}_5$ output from stage FF5 is connected to an input of AND gate 36. The output of the inverter 16 is connected to an input of the AND gate 31 of the first stage FF1. Clock pulses C from clock circuit 8 are applied to the other input of the various AND gates 21 to 27 and 31 to 37. Whenever a clock pulse arrives at the AND gates of a given flipflop, the AND gate in question will be enabled, provided the other input to that AND gate directly connected to the previous stage, or to the Exclusive OR gate 15 and inverter 16, as the case may be, is ONE, and if the state of the preceding stage is a ONE, it can be transferred to the next flipflop. If the output of the Exclusive OR gate 15 is a ONE when a clock pulse arrives at AND gate 21 and, hence, the output of the inverter 16 is a ZERO when a clock pulse arrives at AND gate 31, these outputs can be transferred to the Q or $\overline{Q}$ input circuit, respectively, of the first flipflop FF1. If the Q or $\overline{Q}$ output of a given stage is ZERO, that ZERO can be changed to a ONE upon arrival via the appropriate AND gate of a ONE at the corresponding Q or $\overline{Q}$ input circuit of that flipflop; that is to say, the state of the flipflop can be changes. The arrival of ZERO via the appropriate AND gate, on the other hand, will not affect a change of state of the associated flipflop.

Figure 2:
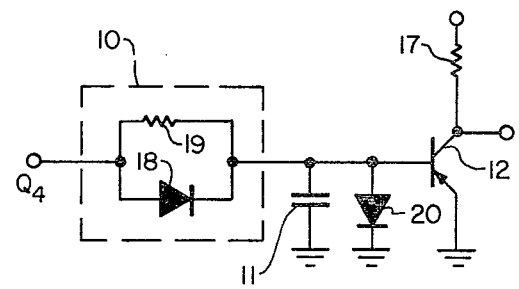
FIG. 2 is a circuit diagram showing the combination of detector, integrator and inverter shown in FIG. 1.

As shown in FIG. 2, the detector 10 is receptive of the Q output of the one of the flipflops. By way of example, the output $Q_4$ of flipflop FF4 is connected to the detector 10 in FIG. 2.

As shown in FIG. 2, the detector 10 may consist of a diode 18 in parallel with a resistor 19 of a medium high resistance value which is much higher than the forward resistance of diode 18 but somewhat lower than the reverse resistance of the diode. The integrator 11 may consist of a capacitor which is fed by the detector 10. A voltage limiting diode 20 may also be included in parallel with the capacitor 11. The inverter 12 may be a convential transistor stage including a biasing resistor 17.

It will be noted that, if all Q outputs from flipflops FF1 to FF7 are ZEROS, that is to say, the shift register contains all ZEROS, there can be no normal sequential shifting of flipflop outputs and the Q output of every one of the stages of the shift register remains a ZERO.

It should be noted that with the first embodiment of FIGS. 1 and 2, wherein the detector-integrator combination is connected between the fourth stage FF4 and the first shift register stage FF1, the output of the inverter 12 is shown as connected to one input of an OR gate 13 while the other input of OR gate 13 is obtained from the Exclusive OR gate 15. This OR gate is here required to permit proper interaction between the Exclusive OR gate output and the first stage FF1 during normal operation without interference from the output of the detector-integrator.

Figure 3:
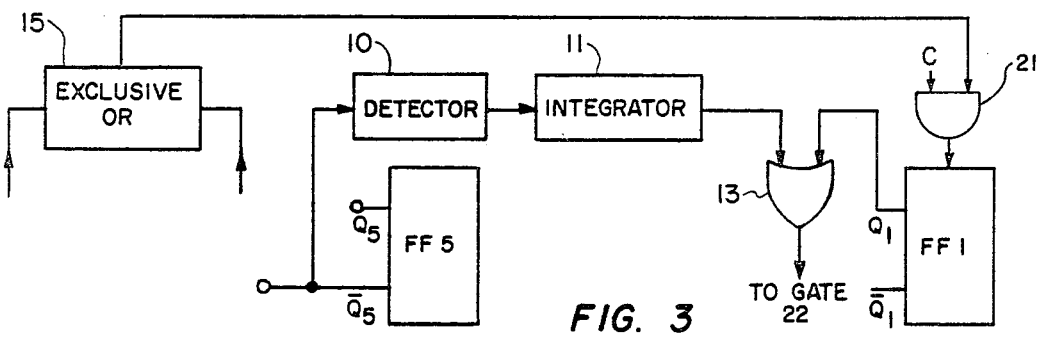
FIG. 3 is a fragmentary block diagram of a feedback shift register showing an alternate means of implementing the embodiment shown in FIG. 1.

As shown in FIG. 3, however, the detector-integrator combination can be disposed between one of the outputs of any of the flipflops and the first input circuit of any other flipflop. In other words, the output of the detector-integrator combination need not be coupled to the first input circuit of the first stage FF1 (the stage to whose first input circuit the output of the Exclusive OR gate 15 is coupled) but can be coupled to any of the AND gates 21 to 27.

In a case such as shown in FIG. 3, the added OR gate will be receptive of the output from the flipflop FF1 preceding the flipflop FF2 to which the output of integrator 11 is coupled.

It will be assumed that the input level to a given stage will be considered a ONE if the voltage level is more positive than −1.5 volts and will be considered a ZERO if it is more negative than −2.0 volts, corresponding, roughly, to a ONE output at the Q output of a flipflop more positive than −0.5 volts and a ZERO at the Q output of the flipflop which is more negative than −3.0 volts.

Assuming normal shifting register operation and the appearance of a ONE input to flipflop stage FF4, the voltage $Q_4$ from the first output circuit of flipflop FF4 supplied to the parallel combination of diode 18 and register 19 (FIG. 2) of the detector 10, say, 0 volts, will appear across the integrator capacitor 11 after a relatively short period determined by the time constant of the detector circuit; it will be noted that the diode will be forward biased by the 0 volt input and will be very low resistance. The integrator voltage will tend to remain at about 0 volt so long as successive ONES appear at the Q output of stage FF4. However, in normal operation of the shift register, ZEROS will occur statistically about as often as ONES. Upon arrival of a ZERO, viz., about −3.5 volts, at the output of flipflop FF4, the detector will be reverse biased by this −3.5 volt level and will have a very high resistance; a resistance of medium high resistance is connected in parallel with this diode. The integrating capacitor will now discharge through the medium high resistance at a relatively slow rate, so that, upon arrival of the next ONE output at flipflop FF4, the voltage across the integrator capacitor will still be close to the previous value of 0 volt. After inversion in inverter 12 of this ONE voltage, a ZERO is obtained and will be applied to the OR gate 13. This will have the effect of flipflop FF1 of placing it under the control of the output of the Exclusive OR gate 15.

Assuming abnormal operation (all ZEROS at the various Q outputs), there will always be −3.5 volts input to the detector from the output $Q_4$ of flipflop FF4. Since the diode is now reverse-biased, the approximately 0 volt level previously existing at the diode output, because of the presence of the last ONE, will, as before, discharge through the medium high resistance in parallel with the diode. This gradual negative-going voltage across the integrator capacitor will continue so long as the ZEROS exist at the output $Q_4$ until, finally, the integrator capacitor voltage reaches a level of about −2.0 volts, which is equivalent to a ZERO at the input of the inverter 12. This ZERO is inverted to a ONE by the inverter 12 and this ONE is applied to the OR gate 13. This ONE passes the AND gate 21 at the input circuit of the first flipflop FF1 and changes the output at Q, from a ZERO to a ONE. Once a ONE appears at one of the Q outputs of the shift register, normal shift register operation resumes.

As previously explained, the input to the detector-integrator 10, 11 can be supplied from the $\overline{Q}$ (second) output of any of the shift register flipflops, as shown in FIG. 3 of the drawing.

In such a case, the connections of the diode 18 are reversed from that shown in FIG. 2 so that the diode is reverse biased during the presence of a ONE at the $\overline{Q}$ output of that flipflop. During normal operation, the capacitor voltage of integrator 11 will tend to be about −3.5 volts in the presence of a ZERO input to the diode 18, since the diode would be forward biased. Upon appearance of a ONE at $\overline{Q}_4$ the diode 18 becomes reverse biased; the integrator capacitor 11 would then discharge through medium high resistor 19 of detector 10 so that the capacitor voltage would tend to go slightly more positive, but still would remain near −3.5 volts so long as ZEROS were interspersed with ONES in the normal fashion. If, however, abnormal operation occurs, viz., ONES remain at all of the $\overline{Q}$ outputs, then the diode 18 remains reverse biased and the integrator capacitor discharges slowly and continuously in a positive direction through the detector resistor 19 until, eventually, the voltage level becomes more positive than −1.5 volts, which voltage level falls within the range of a ONE. This ONE now will be applied directly to the OR gate 13 which is in tandem with AND gate 22 associated with flipflop FF2. The other input to OR gate 13 will be derived from the first output circuit $Q_1$ of the preceding stage FF1. The aforesaid ONE will pass AND gate 22 in the first input circuit of flipflop FF2, thereby causing the first output $Q_2$ of flipflop FF2 to change from a ZERO to a ONE. At this time, normal operation of the shift register can resume. Note that, in this case, a ONE is derived from the detector-integrator 10, 11 during abnormal shift register operation, so that the inverter used in FIGS. 1 and 2 is not required.

Figure 5:
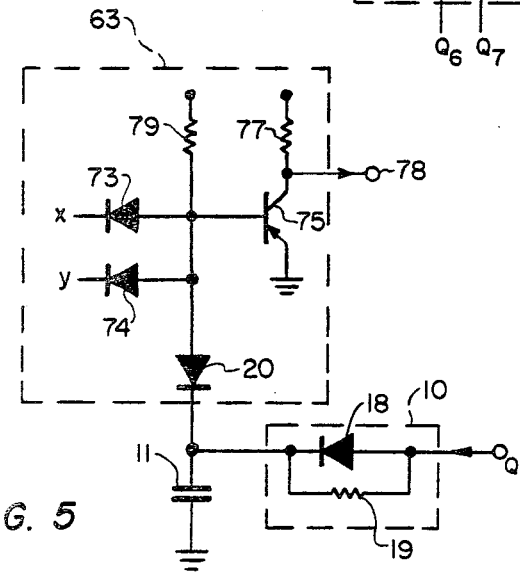
FIG. 5 discloses a circuit diagram of a portion of the Exclusive OR circuit incorporating a detector and integrator such as shown in FIG. 2.

Instead of using an integrator 11, with or without inverter 12, in the manner shown in FIGS. 1 and 2, the integrator may be incorporated in the Exclusive OR circuit 15, as shown in detail in FIGS. 1 and 5. The Exlusive OR gate 15 is inputted from the final stage (FF7 in FIG. 1) of the shift register and from one of the other stages of the shift register; in FIG. 1, the next to last stage FF6 of the shift register is chosen along with the last stage FF7.

Figure 4:
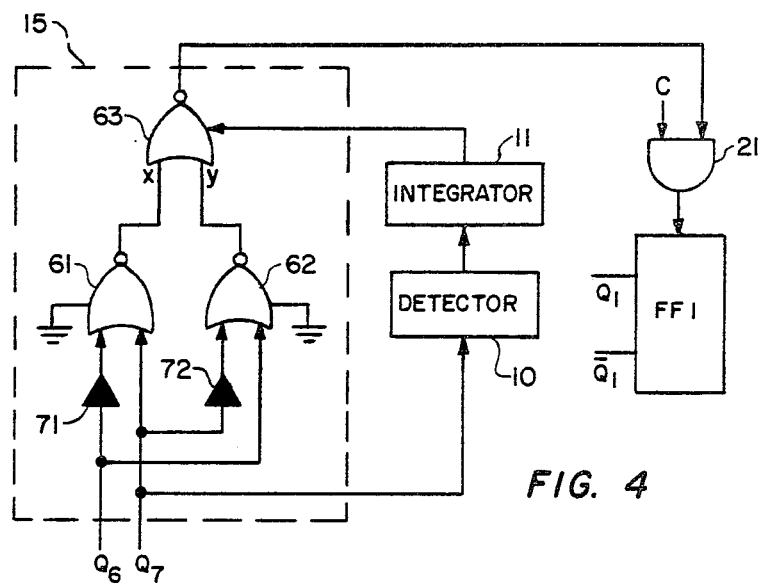
FIG. 4 is a fragmentary block diagram of a feedback shift register incorporating an alternative embodiment of the integration circuit of FIGS. 1 and 2.

The Exclusive OR circuit of FIG. 4, which incorporates the detector 10 and integrator 11, uses three NOR gates 61 to 63. The outputs $Q_6$ and $Q_7$ from flipflop FF6 and FF7 are supplied to NOR gates 61 and 62. By means of inverters 71 and 72, the outputs $Q_6$ and $Q_7$ can also be inverted so that the inputs to NOR gate 61 are $\overline{Q}_6$ and $Q_7$, while the inputs to NOR gate 62 are $Q_6$ and $\overline{Q}_7$. The outputs of NOR gates 61 and 62 are connected to the inputs of NOR gate 63 at points X and Y. The inverters 71 and 72 can be eliminated, if desired, simply by supplying outputs $\overline{Q}_6$ and $Q_7$ from flipflops FF6 and FF7 directly to NOR gate 61 and by supplying outputs $Q_6$ and $\overline{Q}_7$ from flipflops FF6 and FF7 directly to NOR gate 62.

As shown in FIG. 5, the Q input from a flipflop is applied to the diode 18 in shunt with resistor 19 and the output of this detector 10 changes an integrating capacitor 11 during periods of forward bias of diode 18. The integrator 11 is connected in series with a voltage limiting diode 20 which is biased from a positive supply through a resistor 19. The NOR gate 63 includes diodes 73 and 74 connected to points X and Y respectively. The NOR gate 63 further includes a transistor (inverter) stage 75 whose collector circuit contains a suitable biasing resistor 77 connected to a negative supply. The output terminal 78 of the transistor inverter 75 is connected to AND gate 21 associated with stage FF1 in FIG. 1.

The function of inversion is taken care of by the inverter 75 which is an inherent part of the Exclusive OR circuit; consequently, the inverter 12 of FIG. 2 is not needed.

As shown in FIG. 4, there is no requirement for an OR gate 13 following the detector-integrator circuit, as in the first embodiment shown in FIGS. 1 to 3.

Depending upon the construction of the AND gates and the construction of the flipflops, one may combine the detector and integrator, without inverter 12 or OR gate 13, with one of the AND gates 21 to 17 or with one of the flipflops FF1 to FF7.

Since the $\overline{Q}$ (second) outputs of all flipflops (stages) will be ONES during the abnormal shift register condition, and since the $\overline{Q}$=ONE output of a flipflop cannot be converted by application to the corresponding $\overline{Q}$ input circuit of either a ZERO or a ONE, the output of the detector-integrator (with or without inverter) cannot be applied to the AND gates 31 to 37 or to inverter 16 to cure the abnormal condition.

What is claimed is:

1. In combination, a feedback shift register including a plurality of cascaded bistable stages each having complementary first and second output circuits at which two distinct voltage levels may separately appear indicative of a ONE or a ZERO and having associated first and second input circuits, circuit means including a detector receptive of energy from an output circuit of one of said bistable stages and further including an integrator, said circuit means providing an output voltage which represents a ZERO during normal shifting of said shift register and providing an output voltage which is representative of a ONE when the first output circuits of all of said bistable stages remain abnormally at the voltage level indicative of a ZERO over an appreciable time interval,
the output of said integrator being coupled to the first input circuit of another of said bistable stages to convert the voltage level at the first output circuit of any of said stages from a level indicative of a ZERO to a level indicative of a ONE during the aforesaid all-ZERO condition.

2. The combination of claim 1 wherein said circuit means includes an inverter coupled to the output of said integrator.

3. The combination of claim 1 wherein said detector includes a diode which is reverse biased when ZEROS appear at the first output circuit of said one bistable stage and further including an inverter for inverting the output of said integrator.

4. The combination of claim 1 wherein said detector includes a diode which is reverse biased when a ONE appears at the second output cirrcuit of said one bistable stage and wherein the output of said integrator is coupled to the first input circuit of any of said stages.

5. The combination of claim 1 wherein said detector includes a diode in parallel with a resistor having a resistance which is much higher than the forward resistance of said diode and considerably less than the reverse resistance of said diode and wherein said integrator is a capacitor in shunt with said detector.

6. The combination of claim 2 wherein said detector includes a diode in parallel with a resistor having a resistance which is much higher than the forward resistance of said diode and considerably less than the reverse resistance of said diode and wherein said integrator is a capacitor in shunt with said detector.

7. The combination of claim 1 wherein said shift register includes an Exclusive OR gate whose input is coupled to the last of said bistable stages and to a different one of said bistable stages and whose output is applied to an OR gate in the first input circuit of said first bistable stage, and wherein the output of said circuit means is also applied to said OR gate.

8. The combination of claim 1 wherein said shift register includes an Exclusive OR gate whose input is coupled to the last of said bistable stages and to a different one of said bistable stages and whose output is coupled to said first input circuit of said first stage, and wherein said circuit means is incorporated in said Exclusive OR gate.

9. The combination of claim 8 wherein said detector includes a diode in parallel with a resistor having a resistance which is much higher than the forward resistance of said diode and considerably less than the reverse resistance of said diode and wherein said integrator is a capacitor in shunt with said detector.

10. The combination of claim 8 wherein said first input circuit of said first stage includes only a clocked AND gate.

11. The combination of claim 1 wherein said bistable stages are receptive of clock pulses and wherein an output pulse is produced for each m clock pulses and having a pulse repetition rate greater than $r/2^n - 1$ wherein n is the number of binary stages and r is the clock rate, and
   logic gating means for converting said discrete sequence to ONES in all of said first output circuits upon arrival of each mth clock pulse.

12. A pulse train generator according to claim 11 wherein said logic gating means includes an n-input AND gate which is receptive of those outputs of the n stages which contain a ONE after the (M−1)th clock pulse and an inverter in the output of said n-input AND gate.

* * * * *